(12) United States Patent
Mani

(10) Patent No.: US 9,047,963 B2
(45) Date of Patent: Jun. 2, 2015

(54) HIGH DENSITY MAGNETIC MEMORY BASED ON NANOTUBES

(75) Inventor: Krishnakumar Mani, San Jose, CA (US)

(73) Assignee: III HOLDINGS 1, LLC, Wilmington, DE (US)

(*) Notice: Subject to any disclaimer, the term of this patent is extended or adjusted under 35 U.S.C. 154(b) by 653 days.

(21) Appl. No.: 12/202,429

(22) Filed: Sep. 1, 2008

(65) Prior Publication Data

US 2009/0059654 A1     Mar. 5, 2009

Related U.S. Application Data

(60) Provisional application No. 60/969,375, filed on Aug. 31, 2007.

(51) Int. Cl.
G11C 11/16 (2006.01)
B82Y 10/00 (2011.01)
G11C 13/02 (2006.01)

(52) U.S. Cl.
CPC ............... *G11C 11/16* (2013.01); *B82Y 10/00* (2013.01); *G11C 13/025* (2013.01); *G11C 2213/81* (2013.01)

(58) Field of Classification Search
CPC .. G11C 11/16; G11C 11/161; G11C 11/1675; G11C 13/025; G11C 2213/16; G11C 2213/19
USPC .......... 365/158, 171, 173; 977/742, 762, 934, 977/935, 938, 943
See application file for complete search history.

(56) References Cited

U.S. PATENT DOCUMENTS

| | | | |
|---|---|---|---|
| 6,809,361 B2 | 10/2004 | Honlein et al. | |
| 2002/0036918 A1* | 3/2002 | Hidaka | 365/171 |
| 2003/0132461 A1* | 7/2003 | Roesner et al. | 257/213 |
| 2003/0148562 A1* | 8/2003 | Luyken et al. | 438/197 |
| 2006/0086958 A1 | 4/2006 | Eimori | |
| 2006/0174473 A1* | 8/2006 | Oh et al. | 29/603.08 |
| 2006/0250856 A1 | 11/2006 | Bertin et al. | |
| 2008/0135892 A1* | 6/2008 | Finnie | 257/288 |
| 2008/0310213 A1* | 12/2008 | Chen et al. | 365/158 |
| 2010/0090265 A1* | 4/2010 | Bhattacharyya et al. | 257/315 |

* cited by examiner

*Primary Examiner* — J. H. Hur
(74) *Attorney, Agent, or Firm* — McAndrews, Held & Malloy, Ltd.

(57) ABSTRACT

A novel magnetic memory cell utilizing nanotubes as conducting leads. The magnetic memory cell may be built based on MTJ (Magnetic Tunnel Junction) or GMR (Giant Magneto Resistance) sensors or devices of similar nature. A SET (Single Electron Transistor) made of semiconducting nanotubes may be used as access devices and/or to build peripheral circuitry.

23 Claims, 20 Drawing Sheets

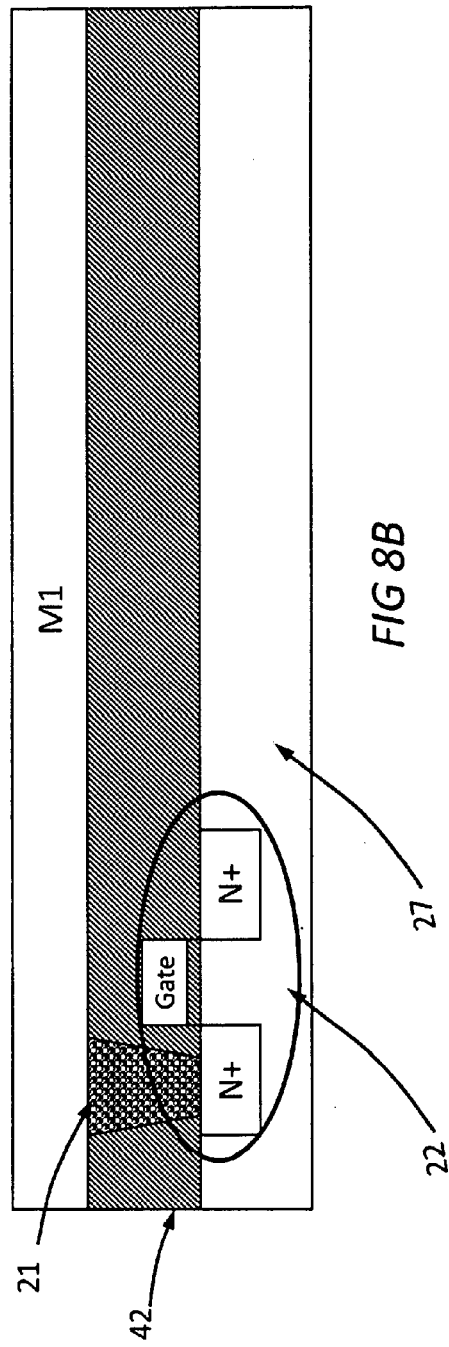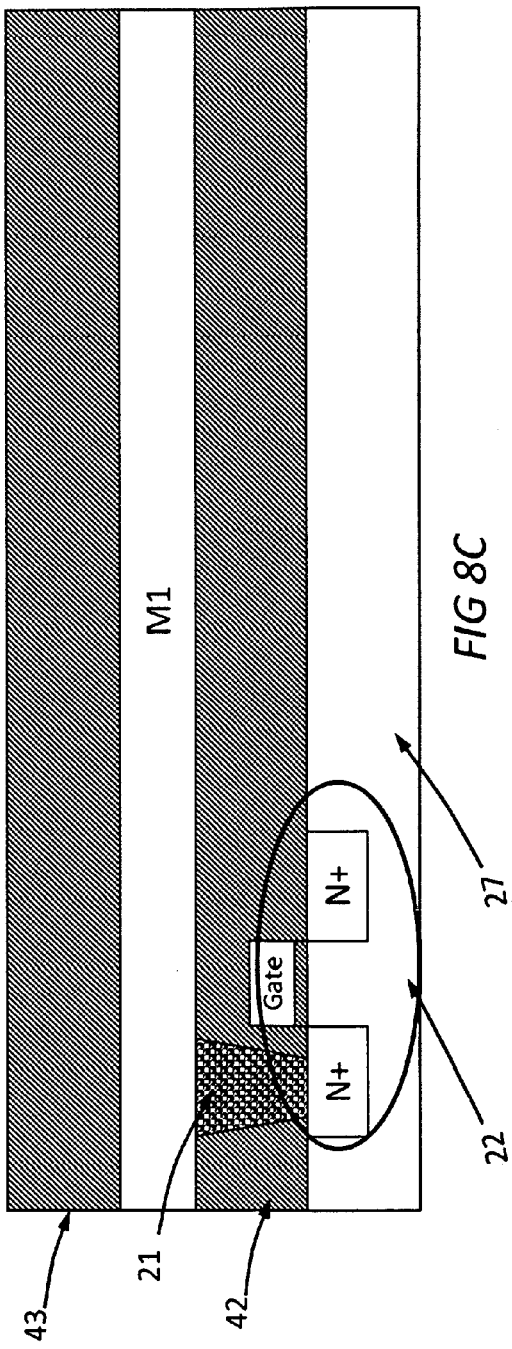

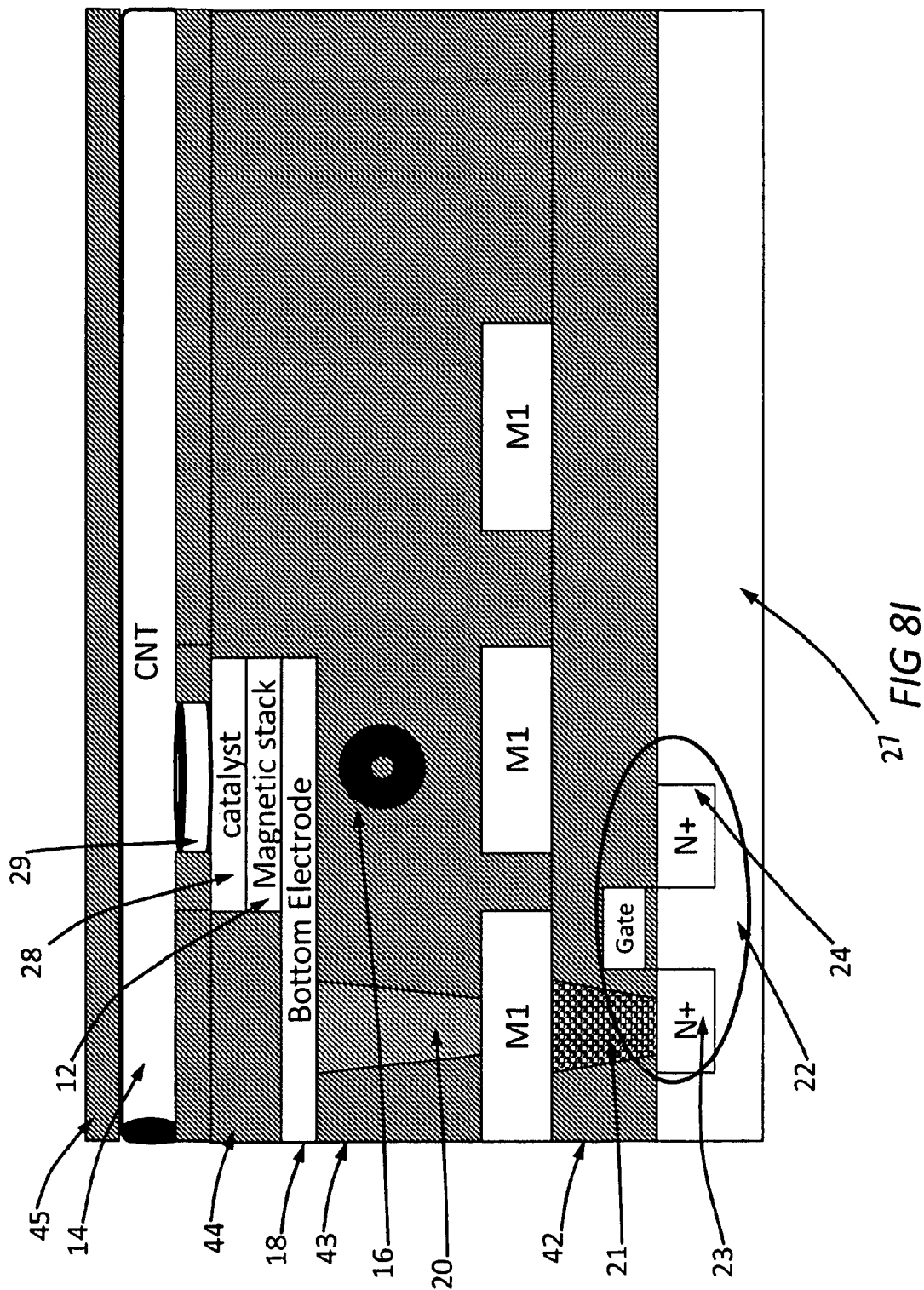

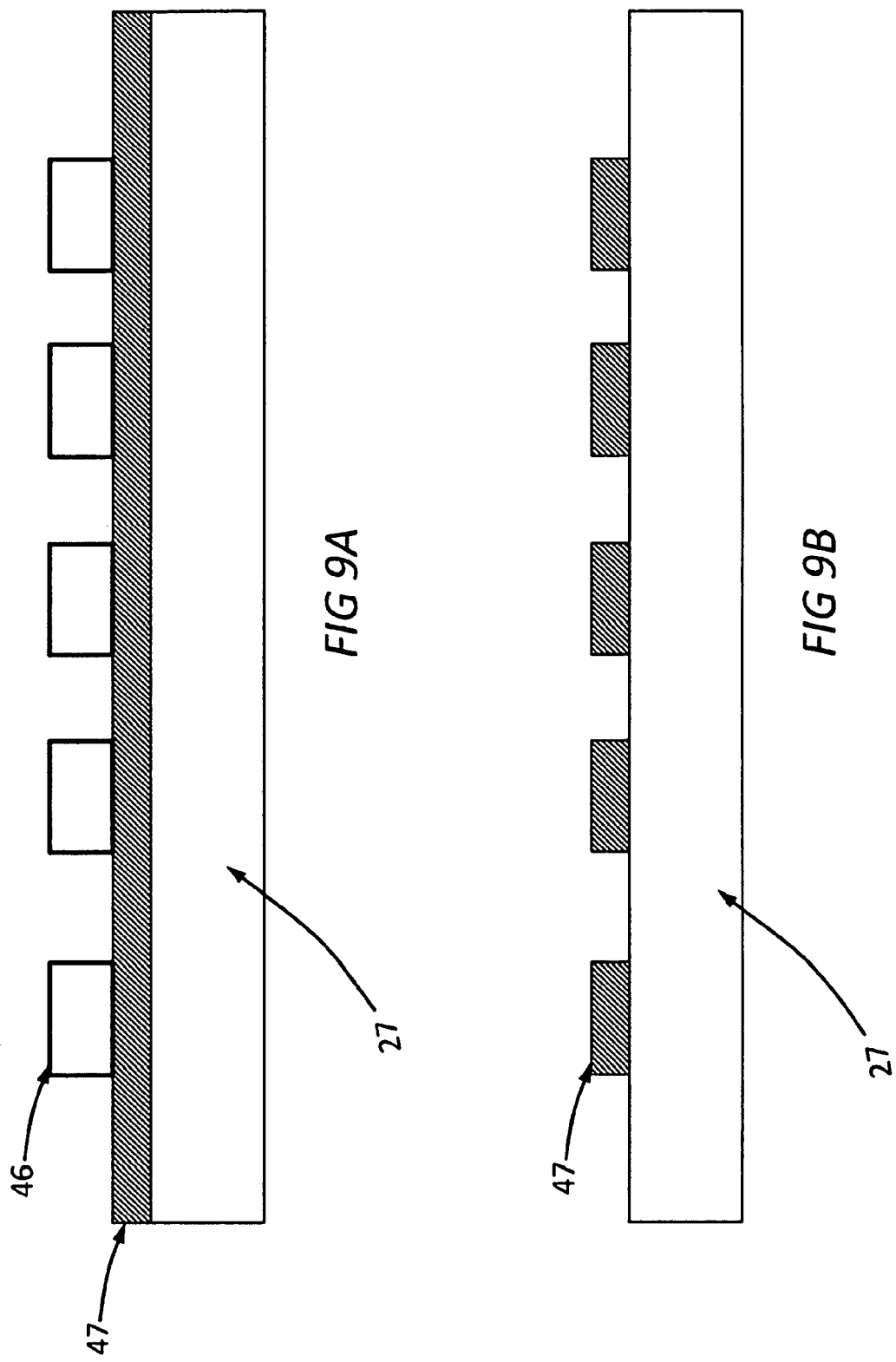

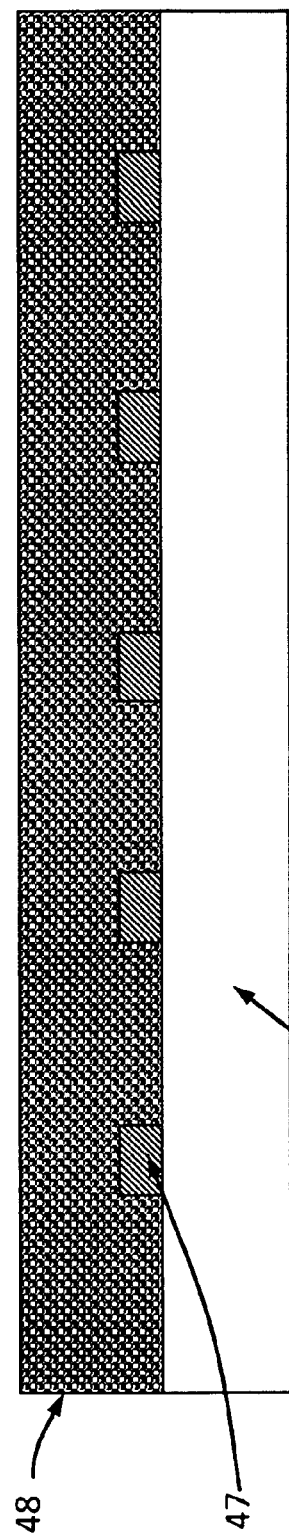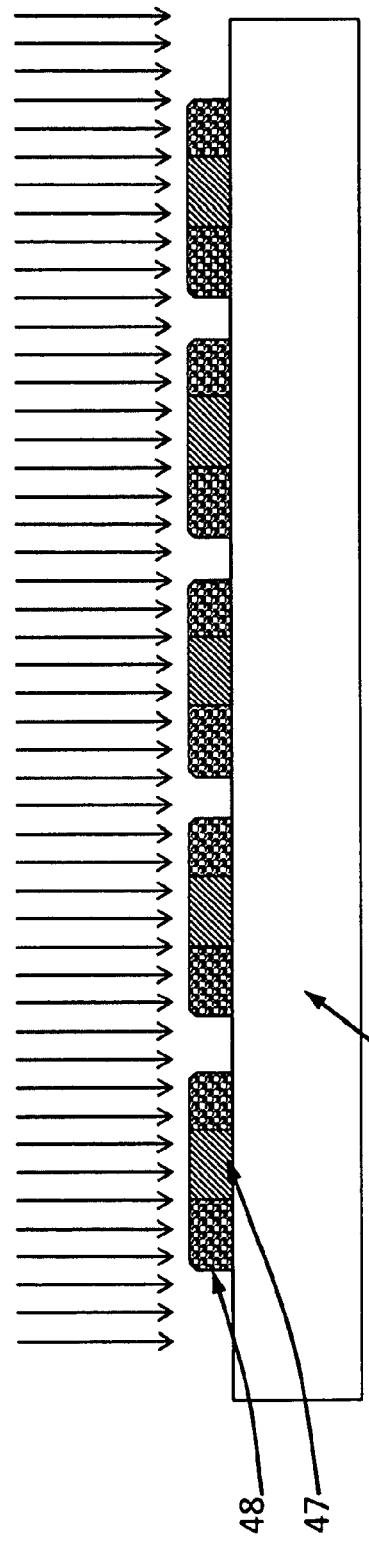
FIG 9C
FIG 9D

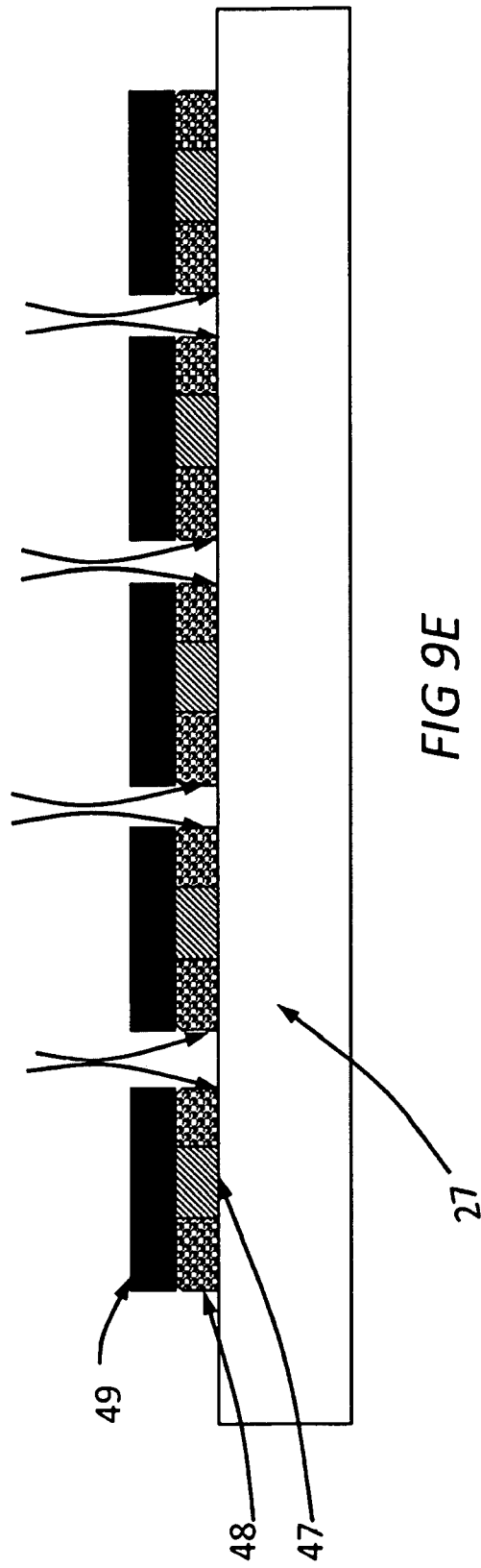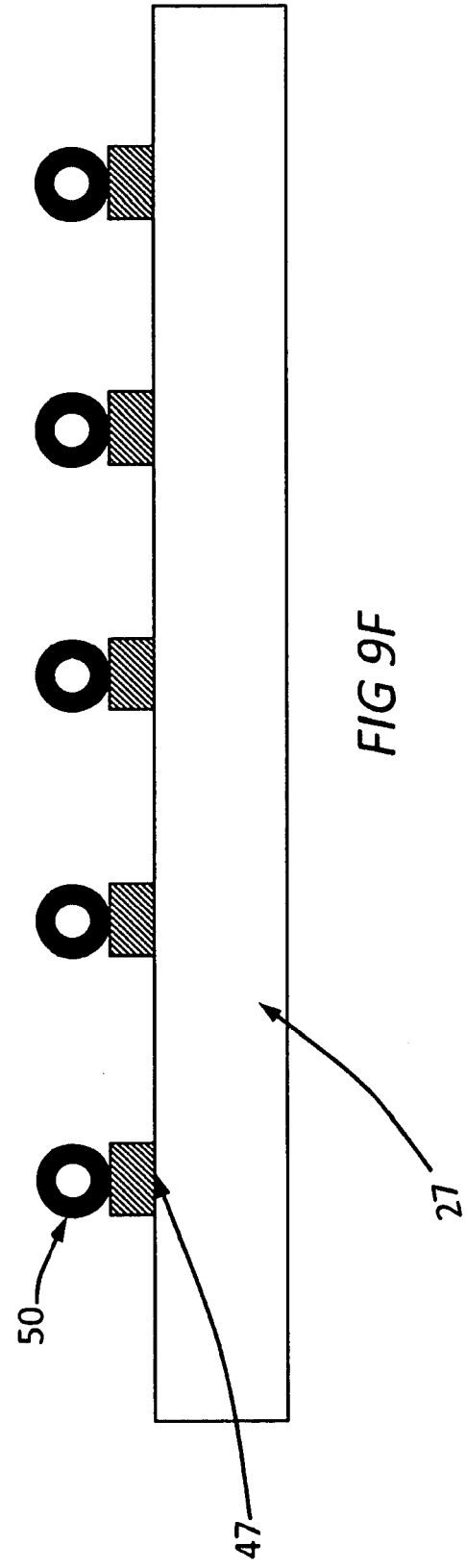

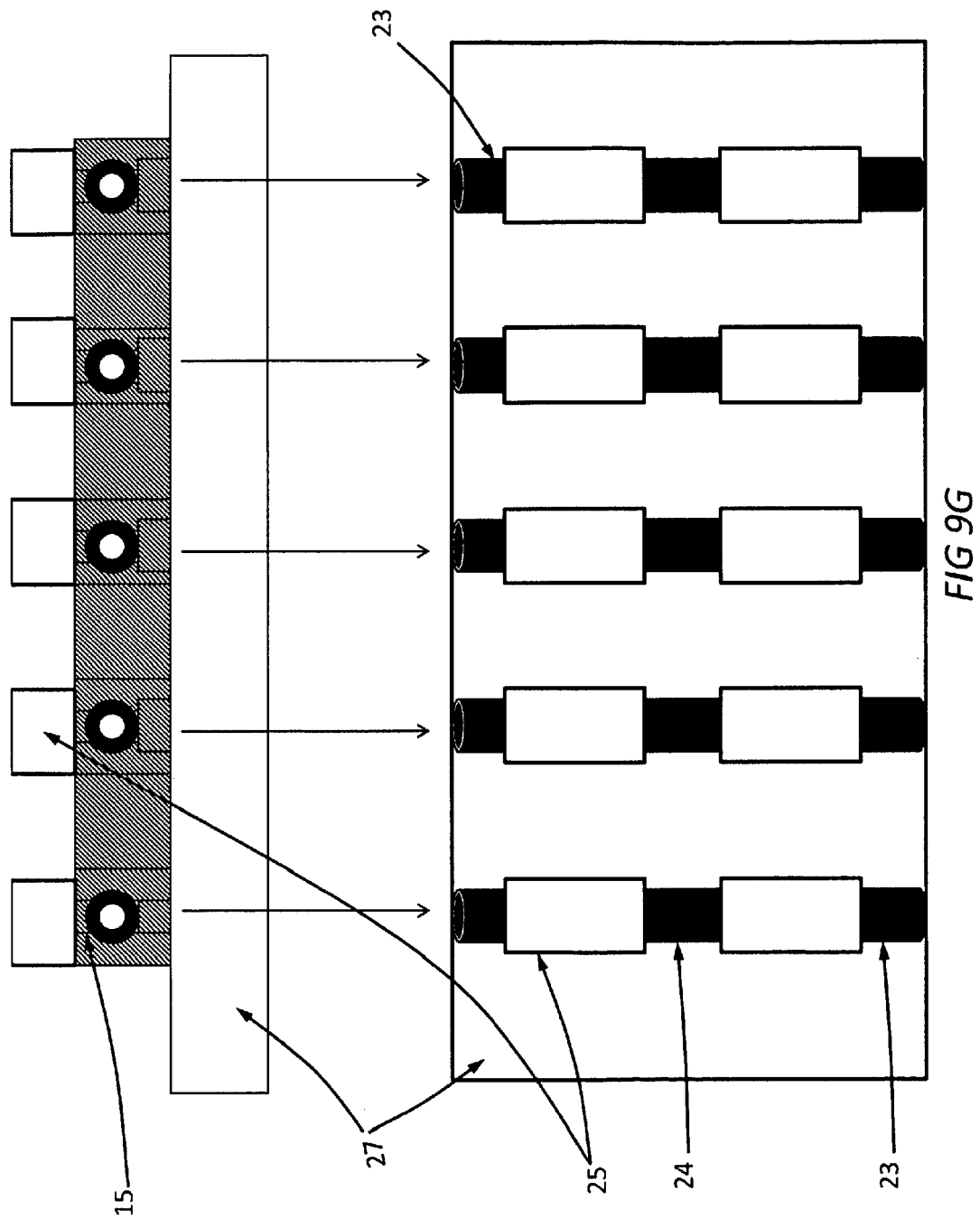

HIGH DENSITY MAGNETIC MEMORY BASED ON NANOTUBES

This application claims the benefit of priority to U.S. Provisional Patent Application No. 60/969,375, filed Aug. 31, 2007, the entire specification of which is hereby incorporated by reference.

FIELD

Embodiments of the present invention relate to solid state memories.

BACKGROUND

Referring to FIG. 1 of the drawings, there is shown a magnetic memory cell 10, known to the inventor. As will be seen, the cell 10 includes a magnetic storage element in the form of a magnetic tunnel junction (MTJ) 12. The cell 10 also includes a Y write/read line 14 for carrying a write/read current. The line 14 lies in the plane of the page. An X write line 16 extends into the plane of the page and carries a current for performing a write operation. A bottom electrode 18 is in contact with the storage element 12 as is shown in FIG. 1. The electrode 18 is coupled to an access transistor 22 by means of a conductive via 20. The access transistor 22 is made of drain terminal 23, source terminal 24, gate terminal 25 and conductor 26. The access transistor and other circuitry required to make memory devices are realized on semiconductor substrate 27 and are well known to one skilled in the art.

In the memory cell 10 the structures 14, 16, 18, 20, and 26 are realized by using metallic materials such as copper. In the quest to achieve high density memory devices, the physical dimensions of the cell 10 have to be reduced. Efforts to reduce the dimensions of the magnetic memory cell 10 in order to produce high density memory devices are being hampered by the phenomena of electro-migration in the metallic structures 14, 16, 18, 20 and 26 when the dimensions of these structures are reduced.

SUMMARY

A novel magnetic memory cell utilizing nanotubes as conducting leads is disclosed. The magnetic memory cell may be built based on MTJ (Magnetic Tunnel Junction) or GMR (Giant Magneto Resistance) sensors or devices of similar nature. A SET (Single Electron Transistor) made of semiconducting nanotubes may be used as access devices and/or to build peripheral circuitry.

Other aspects of the invention will be apparent from the detailed description below:

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form only in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although the following description contains many specifics for the purposes of illustration, anyone skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Figure 1:
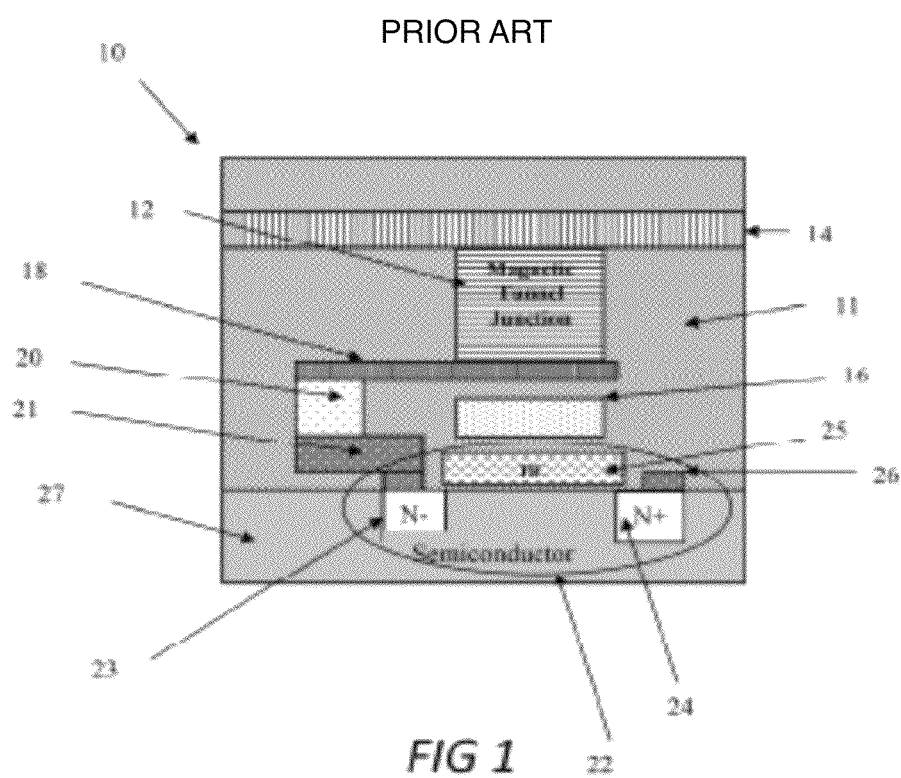
FIG. 1 shows a cross-section through a conventional magnetic memory cell.

FIG. 1 of the drawings shows a cross-section through a typical magnetic memory cell. In the cell 10, the conductive structures 14, 16, 18, 20 and 21 are the conductive wires in the backend of the semiconductor processing which in general are made of Aluminum, Aluminum alloy, Copper, Tungsten etc. The gate electrode 25 of a transistor 22 and in general is fabricated with metals or doped poly silicon or similar materials. The access transistor 22 which represents all the semiconductor memory access circuitry essential for the function of a memory device is fabricated using semiconductor process technology.

Figure 2:
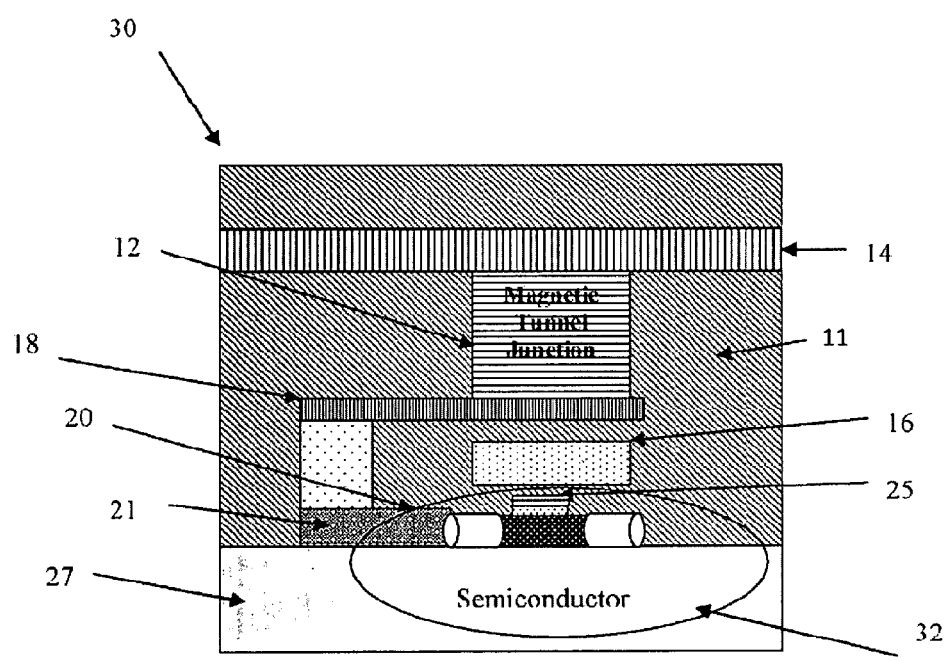
FIG. 2 shows a cross-section through a CNT magnetic memory cell, in accordance with one embodiment of the invention.
Figure 3:
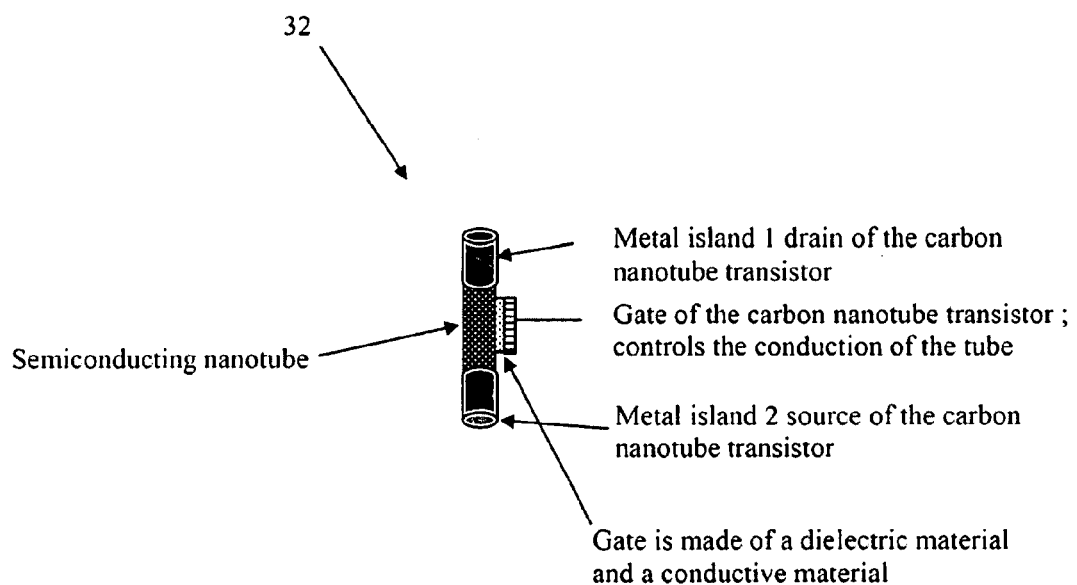
FIG. 3 shows the structure of an access transistor constructed using on CNTs in accordance with one embodiment of the invention.
Figure 4:
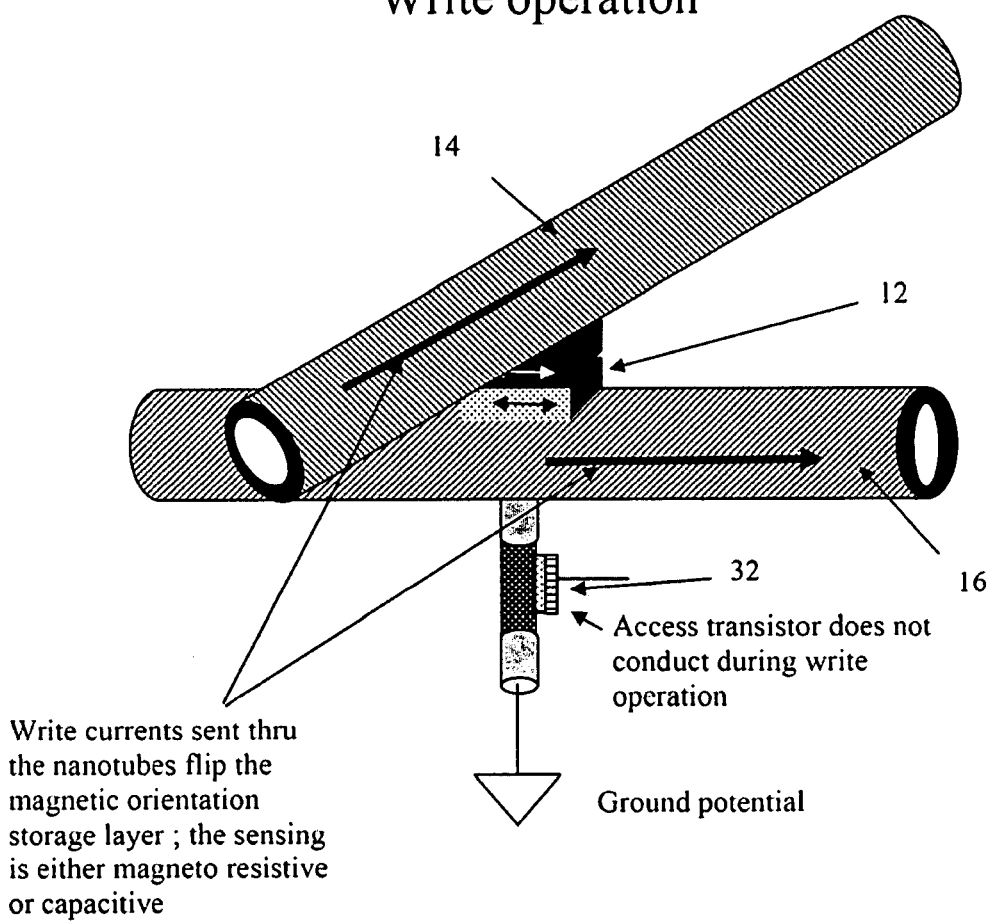
FIGS. 4 and 5 illustrate write and read operations in accordance with one embodiment of the invention.
Figure 5:
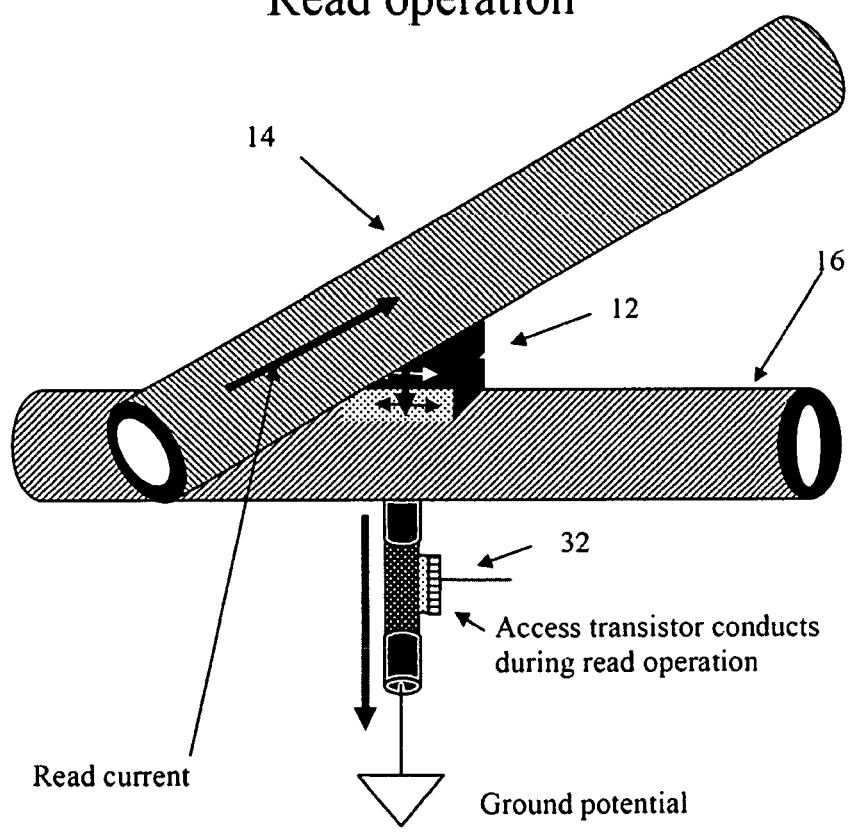
Figure 6:
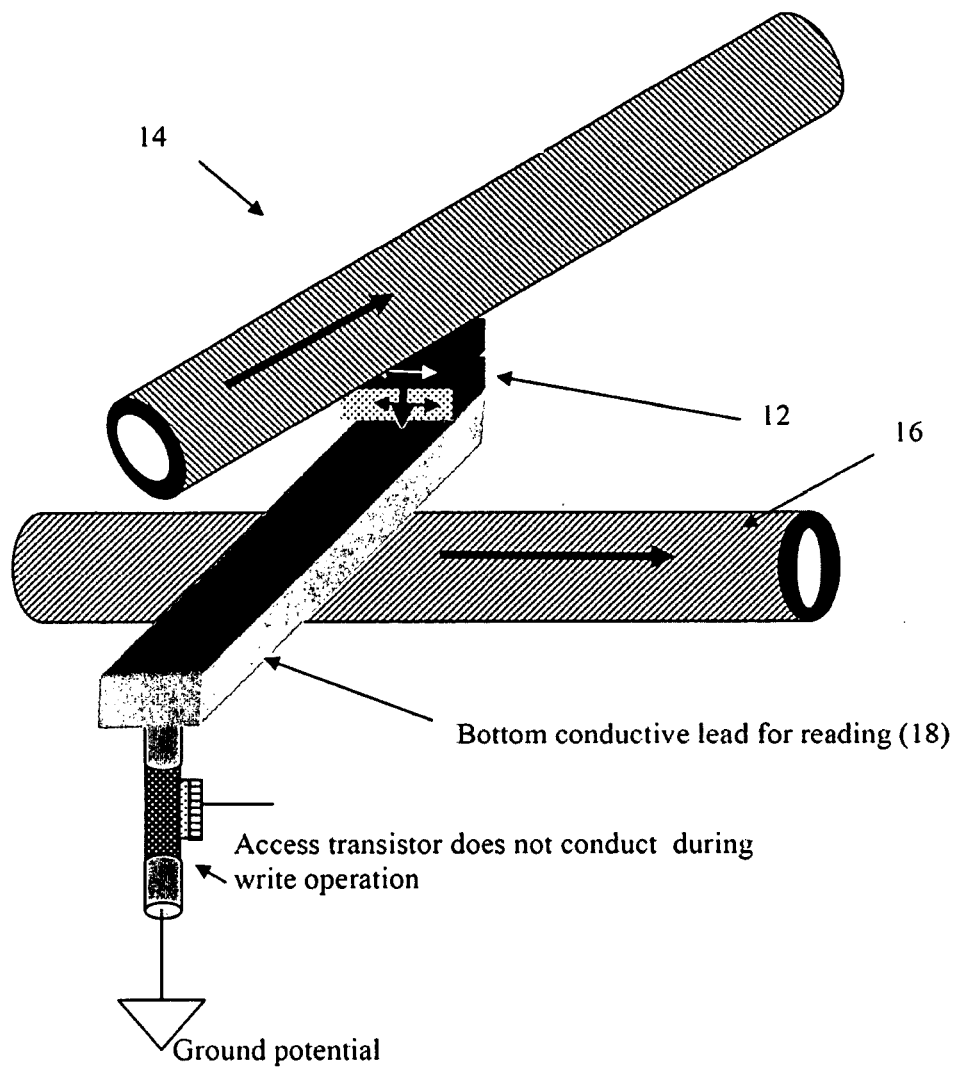
FIGS. 6 and 7 illustrates write and read operations in accordance with one embodiment of the invention.
Figure 7:
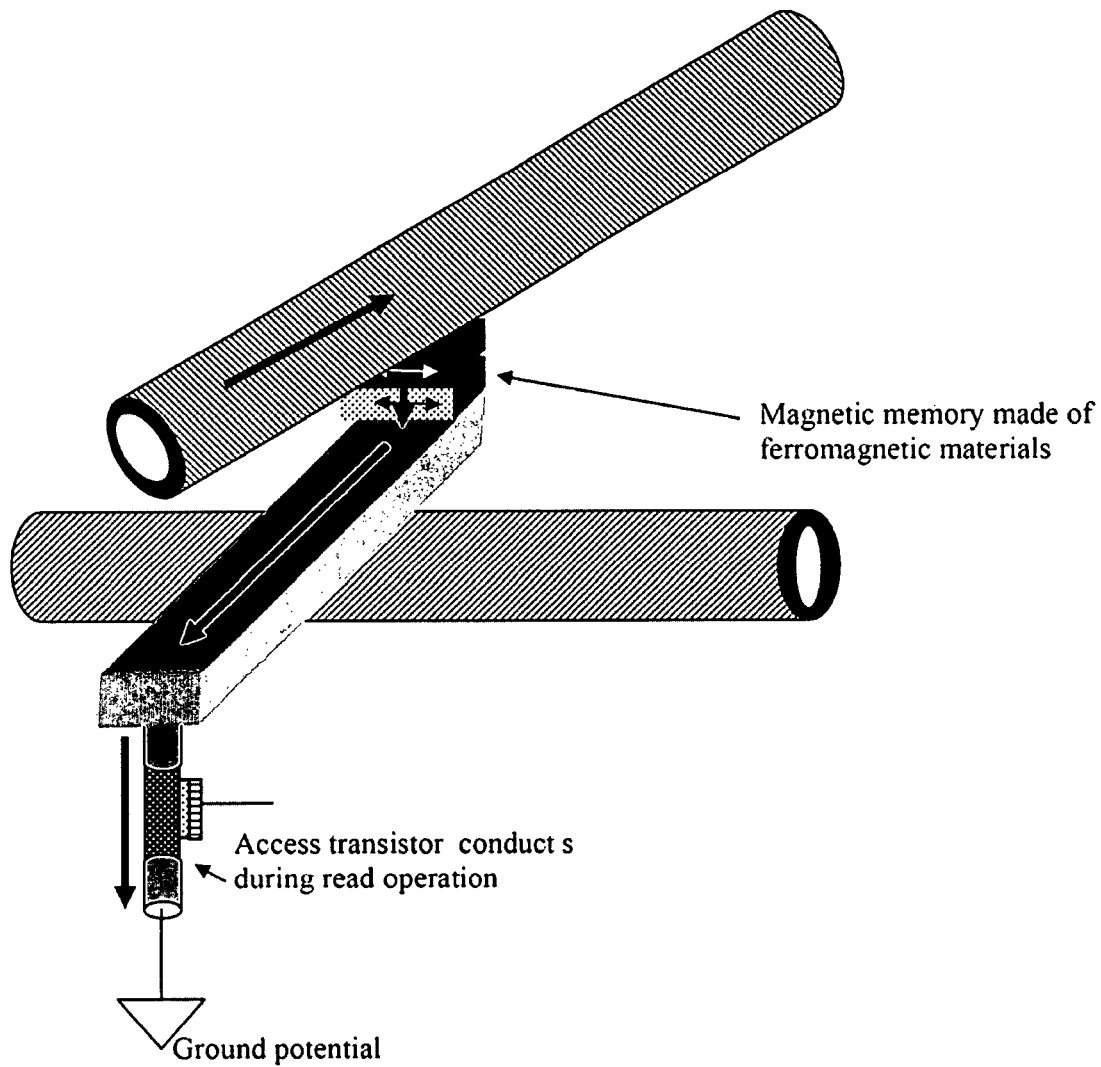

FIG. 2 of the drawings shows a cross-section through a magnetic memory cell 30, in accordance with one embodiment of the invention. As will be seen, the magnetic memory cell 30 includes nanotube structures, and is thus referred to as a nanotube-based memory cell. In the cell 30, the metallic structures 14, 16 and 18, have been fabricated using nanotubes as opposed to metallic materials. Further, the access transistor 22 of FIG. 1 is replaced with a semiconducting nanotube access transistor 32. The structure of the transistor 32, in accordance with one embodiment is shown in FIG. 3 of the drawings. The gate electrode 25 of access transistor is fabricated using nanotube as well.

Because the structures 14, 16, 18, and 25 have been fabricated using nanotubes, the dimensions of these structures may be reduced to a much greater extent than the equivalent metallic structures, without the problems of electromigration, due to the highly conductive nature of nanotubes.

The nanotubes may be Single Wall NanoTubes or Multi Wall NanoTubes. In one embodiment, the nanotubes may be formed by rolling graphene sheets into long tubes, in accordance with one embodiment.

In one embodiment, the carbon nanotubes may be grown by Chemical Vapor Deposition (CVD) techniques from Carbon rich gases like (CH4, C2H4 etc.). In one embodiment, a catalyst for growing the nanotubes may be Molybdenum, Iron or materials with similar properties for extruding excess carbon from their grains at high temperature).

For illustrative purposes, the nanotubes described hereinafter will be limited to carbon nanotubes (CNTs), and the MRAM cells that include these CNTs are thus CNT-based MRAM cells.

Figure 8A:
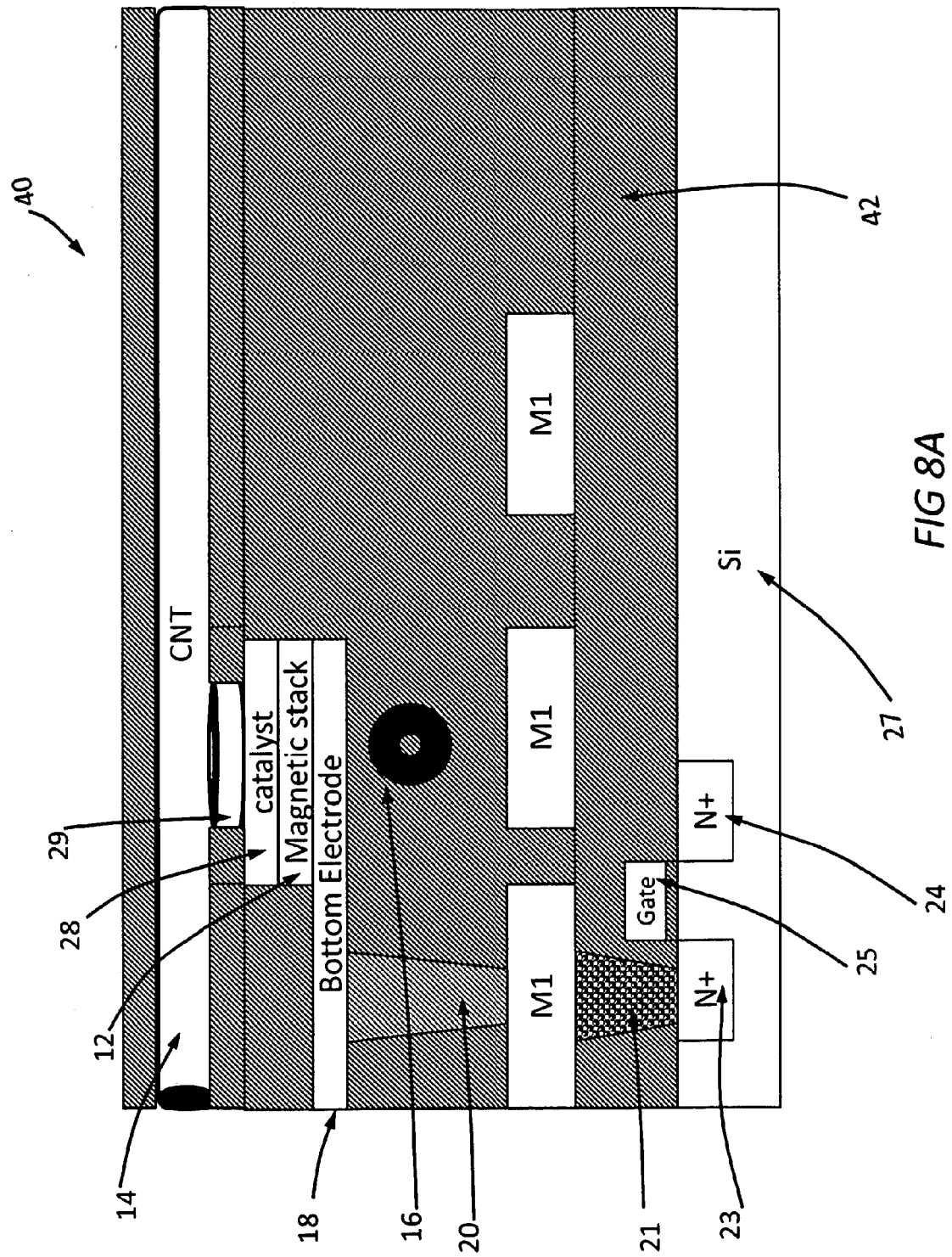
FIG. 8 illustrates a method for fabricating an MRAM device using CNTs, in accordance with one embodiment of the invention.
Figure 8D:
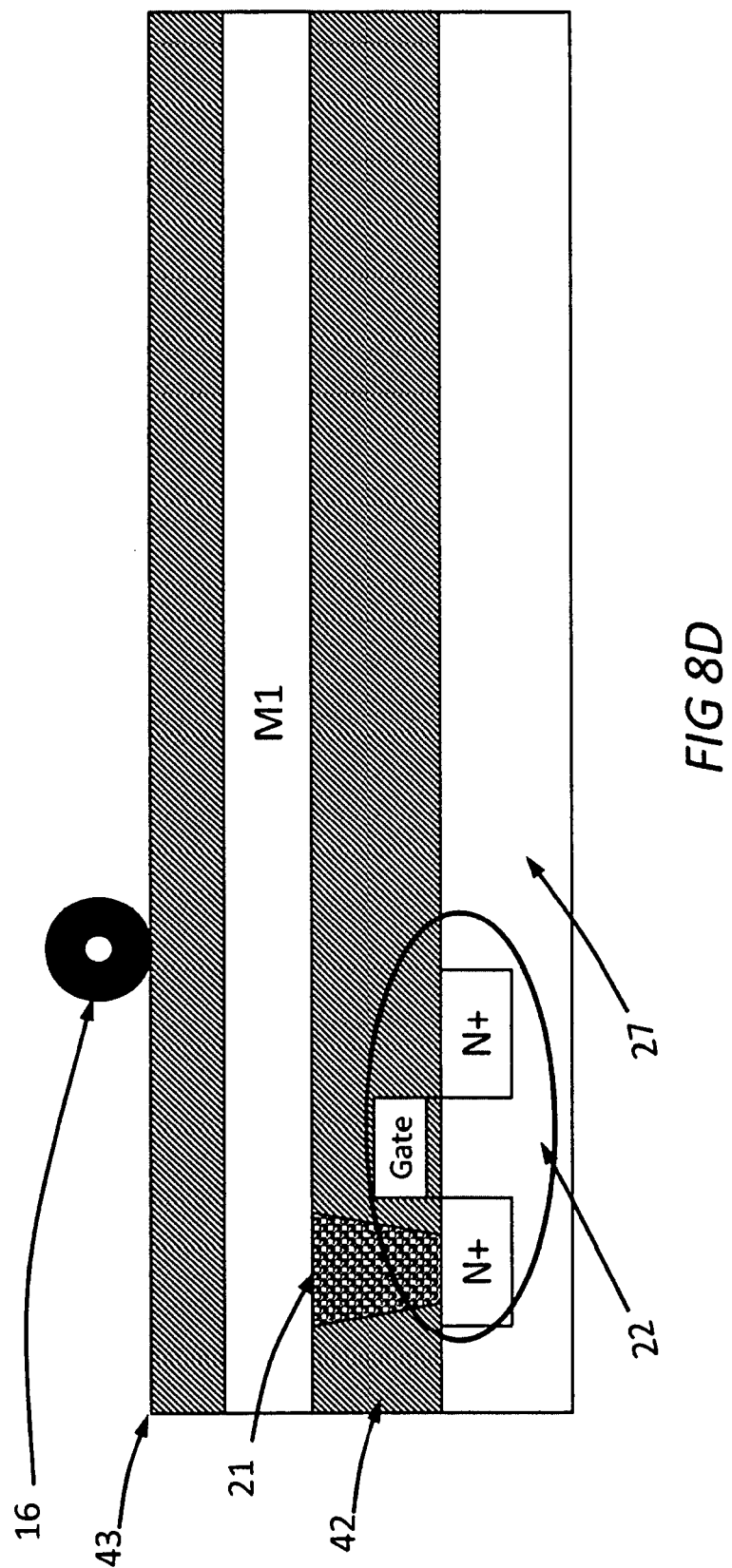

FIG. 8A shows a cross section through a MRAM cell 40 in accordance with one embodiment of the invention. The MRAM cell comprises many structures in common with the MRAM cell 10, and for the sake of clarity, these structures have been indicated with the same reference numerals. The process steps to manufacture the MRAM cell 40 will now be described with reference to FIGS. 8B to 8I.

Referring to FIG. 8B the process begins with the fabrication of the components necessary for implementing addressing, sensing, and logic functions essential for the functioning of the MRAM cell. The components may be manufactured on a substrate 27 comprising, e.g. Si, Ge, GaAs, glass, ceramic, etc. In one embodiment the components may be fabricated using standard semiconductor device fabrication techniques know to one skilled in the art.

Figure 8E:
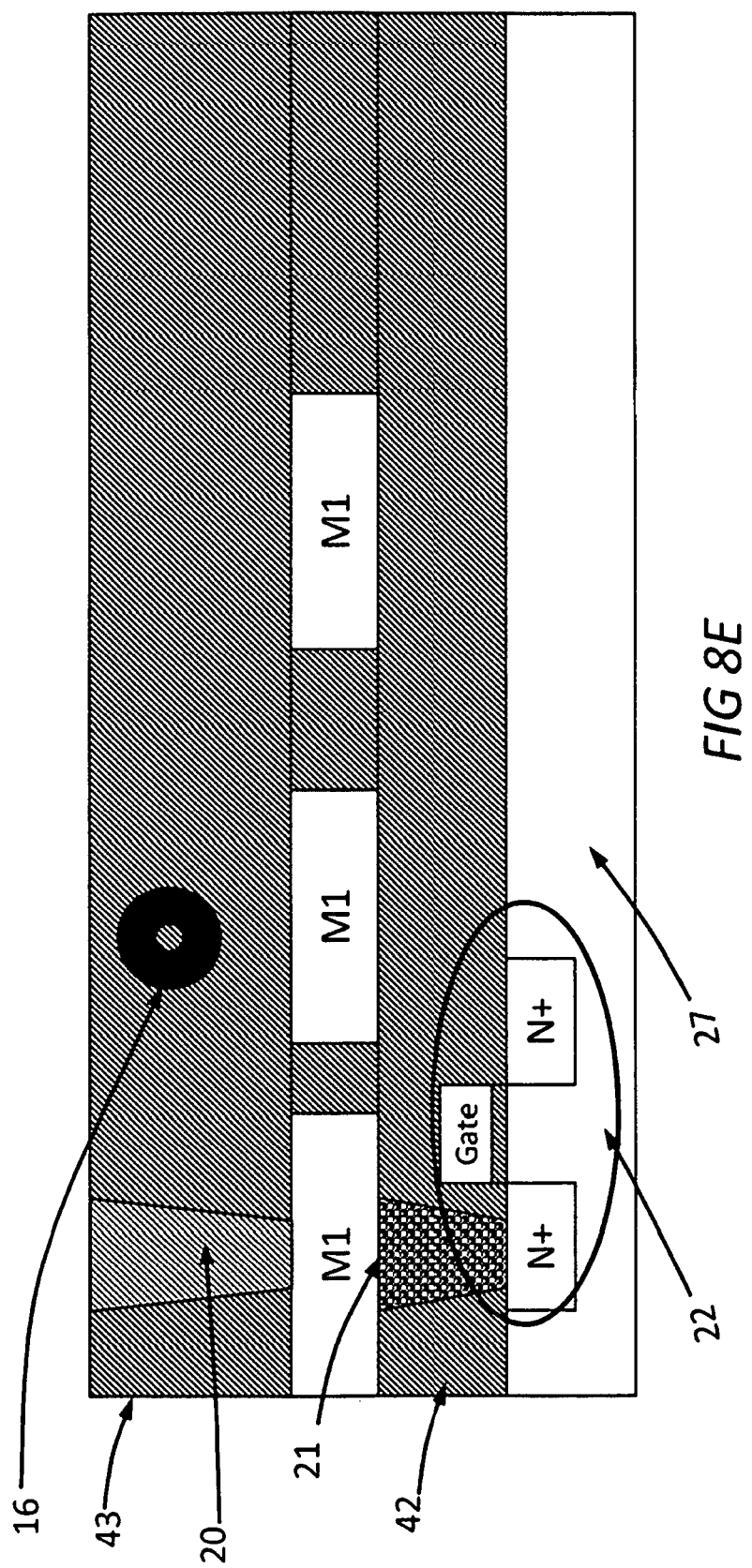
Figure 8F:
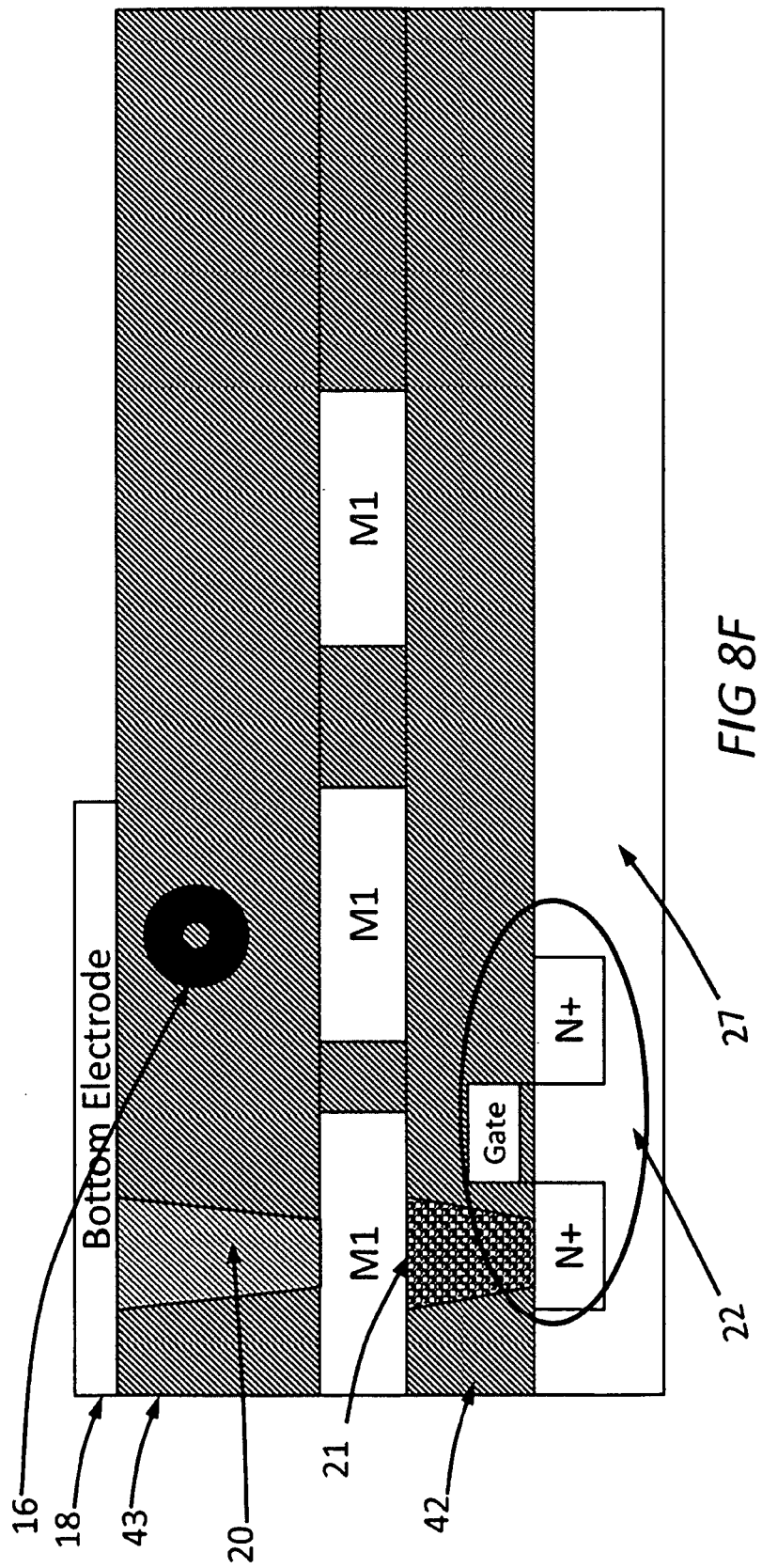
Figure 8G:
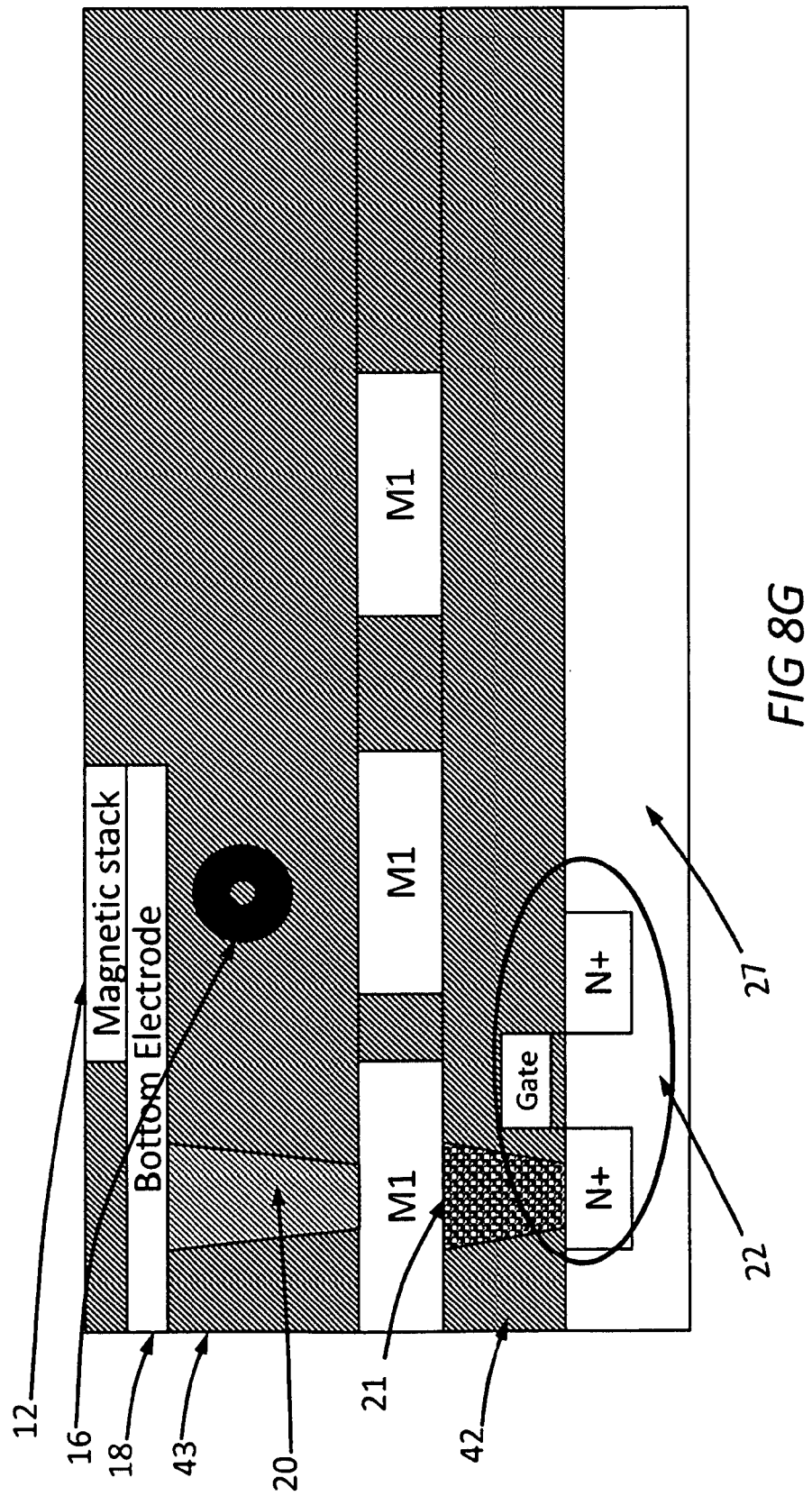
Figure 8H:
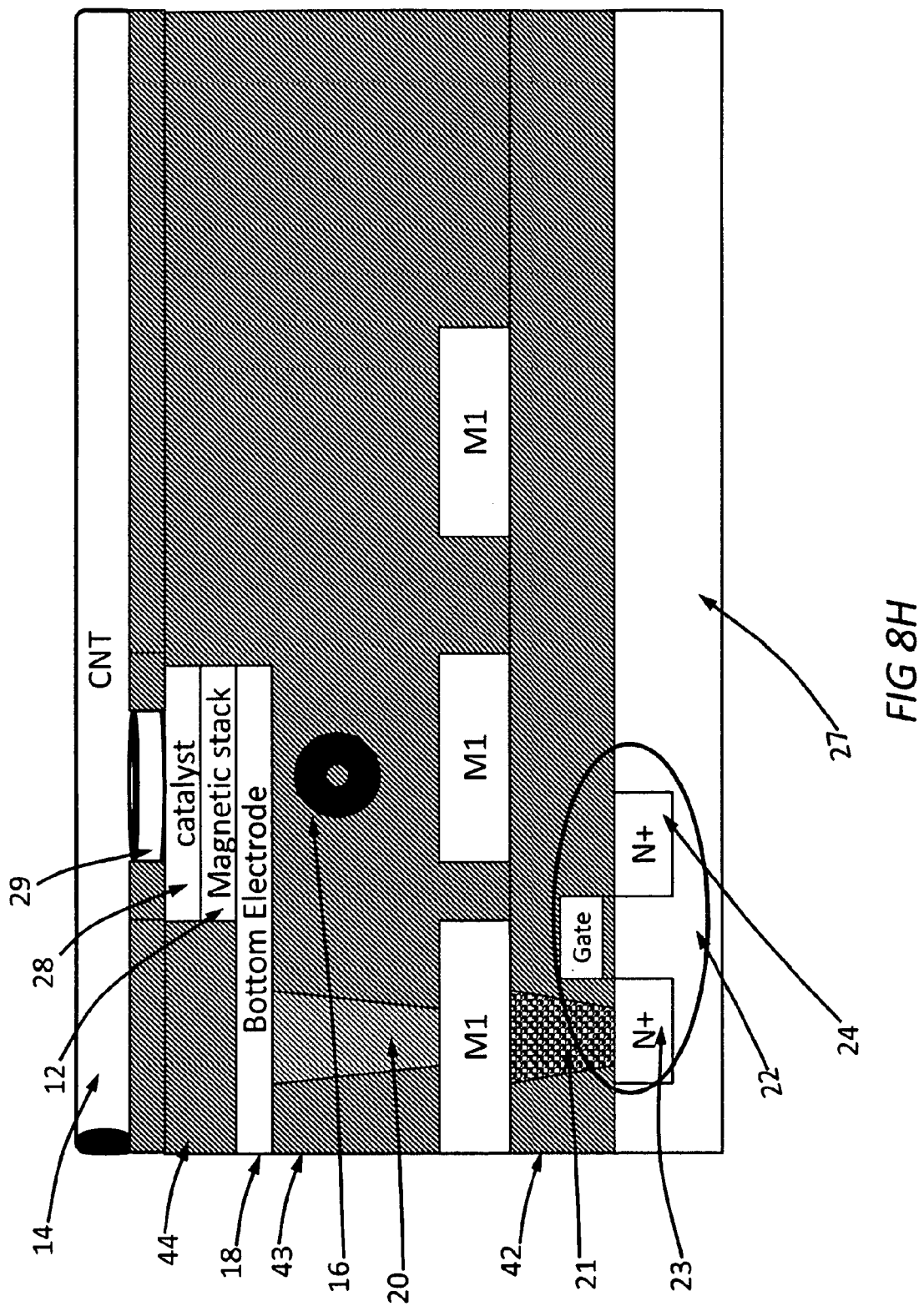

Thus in FIG. 8B, the transistor circuitry 22, and the metal layer indicated by M1 are fabricated using standard semiconductor device fabrication techniques. Thereafter, an insulating layer 43 comprising, e.g. SiO2 is deposited over the layer M1 as shown in FIG. 8C. Next, a carbon nanotube 16 (see FIG. 8D) is fabricated by CVD, PECVD, or other techniques. In one embodiment the carbon nanotubes may be formed and connected with the help of Scanning Electron Microscopy techniques. In one embodiment, the carbon nanotubes may be a few tens of nanometers to a few hundred nanometers in cross sectional diameter. They may be of few hundred microns long. Referring to FIG. 8E a via 20 is formed in the layer 43 by standard lithographic and etching techniques. Thereafter, a bottom electrode 18 typically made of conductors is formed as shown in FIG. 8F. Then a magnetic stack 12, e.g. comprising a Magnetic Tunnel Junction of various structures is deposited and patterned as shown in FIG. 8G. Referring to FIG. 8H, a CNT 14 is grown horizontally on top of the magnetic stack 12. Then a dielectric 44 is grown and the magnetic stack 12 with catalyst 28 is exposed with a mask. The magnetic stack typically would have a catalytic material 28 to initiate CNT growth 29 vertically, which in turn would join with the horizontally grown CNT 14. According to FIG. 8I an insulating layer 45 is deposited on top of the device thus fabricated.

In another embodiment the access transistor 22 of FIG. 1 can be replaced by a semiconducting nanotube transistor 32 which is illustrated in FIG. 3. The semiconducting NT transistor of FIG. 3 is made of a semiconducting nanotube such as Carbon, Si, Ge, GaAs, CdTe etc. The semiconducting NT does not conduct current until a charge is inserted or induced into it. Referring to FIG. 3 there is no current flow when a nominal voltage for example 1 to 3V is applied between the two ends of the tube indicated as metal island 1 and metal island 2. When a small positive voltage for example 0.5 to 1V is applied to the gate it induces negative charge in the NT and increases the current flow. If a negative voltage of same magnitude was applied to the gate a positive charge is induced in the NT which reduces the current flow. Thus, transistor functionality is achieved. The fabrication of the semiconducting nanotube transistor is illustrated in FIG. 9.

Figure 9H:
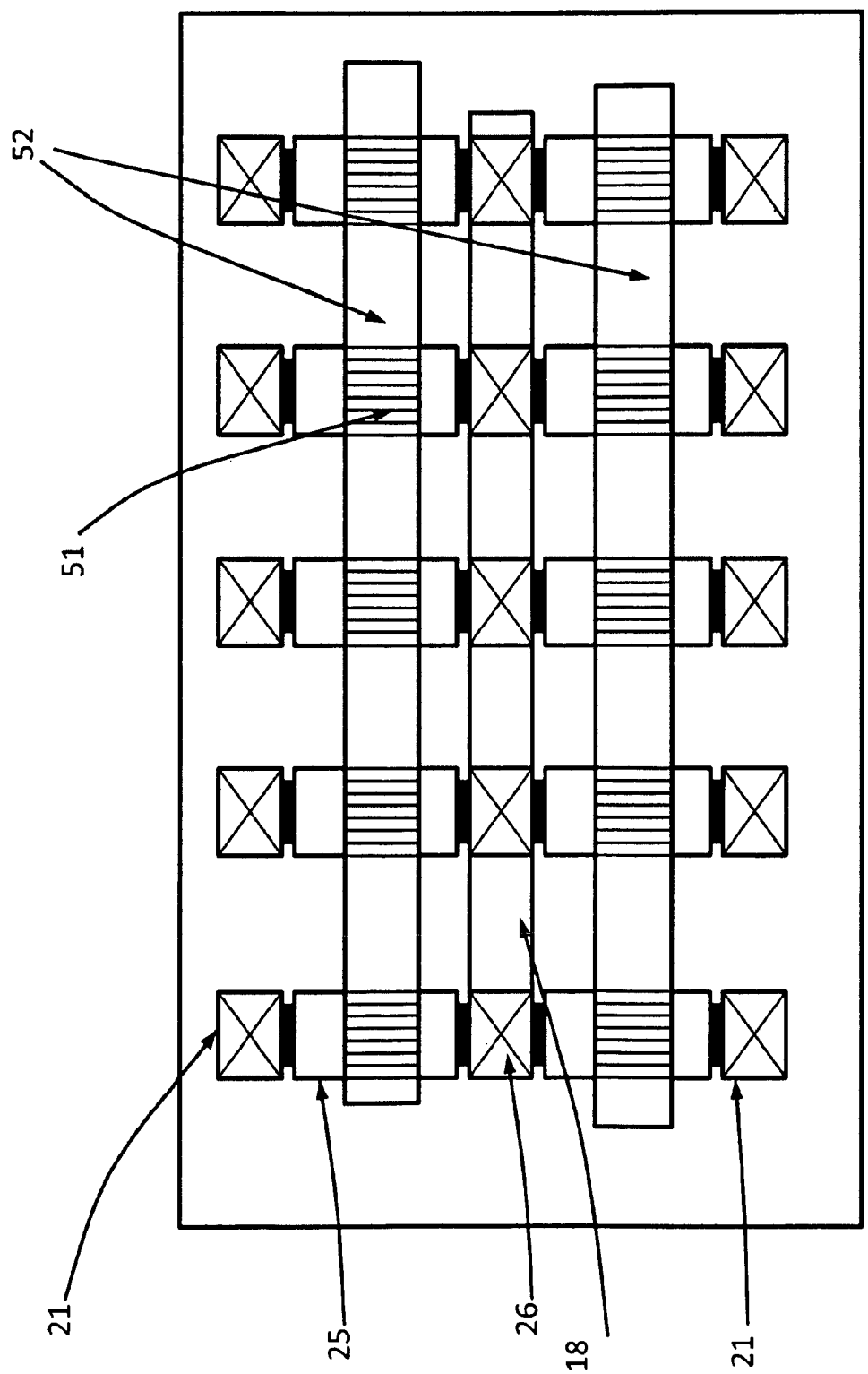
FIG. 9 shows processing steps for manufacturing semiconducting nanotube based transistors and a method to integrate them into an MRAM array, in accordance with an embodiment of the invention.

Initially an array of islands made of insulating materials 47 is created as shown in FIG. 9A and FIG. 9B. In FIG. 9A a photo resist 46 is coated and patterned using lithographic techniques. Then either a metallic layer or an insulating layer 48 with different etch rate with respect to the insulating islands 47 is deposited as shown in FIG. 9C. Then an anisotropic etch is done as shown in FIG. 9D. This leaves a thin sidewall on the sides of the insulating islands. Then a semiconducting material or materials 49 which will form the NT is/are deposited as shown in FIG. 9E. Then the semiconducting layer is patterned to leave the material on top of the island and side walls. This step is not illustrated as it is know to one skilled in the art. Referring to FIG. 9F an isotropic etch is done to selectively etch the material 48 but not the material(s) 49. When the material underneath the semiconducting materials is removed in this fashion the semiconducting material 49 curls up into a nanotube 50. FIG. 9G shows the nanotubes thus formed in plan view. The semiconducting NT created thus can be patterned with a thin gate oxide 15 and a gate material 25 as shown in FIG. 9G, which shows a 2×5 array of transistors formed in this process. The three terminals of the semiconducting NT transistors are gate 25, source 24 and drain 23. In FIG. 9H the respective contacts for the respective terminals are shown. In one embodiment, the sources of all the transistors may be contacted with source line 18 and can be tied to ground potential. The gates may be contacted and tied together by conductive line 52 for a row of cells as shown in FIG. 9H. In one embodiment, the drain contacts 21 may be tied to the individual memory cells through the bottom electrodes 18 as illustrated in FIG. 8I. At this point the same process flow shown in FIG. 8F to 8I may be followed to achieve the MRAM devices illustrated in FIGS. 2, 4, 5, 6, and 7. Simple differences in process steps which are obvious to one skilled in art may be ignored.

Embodiments of the present invention also extend to a memory device comprising an array on nanotube-based MRAM cells as disclosed herein.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A memory device, comprising:
an array of magnetic random access memory cells arranged in a grid, wherein each magnetic random access memory cell comprises:
a word line;
a bit line;
a magnetic storage element disposed between the word line and the bit line; and
an access transistor located below the bit line and electrically connected thereto, wherein the access transistor is defined by a semiconducting nanotube patterned with a gate oxide and a gate material to form a gate therein, wherein a portion of the semiconducting nanotube on one side of the gate forms a drain, and a portion of said semiconducting nanotube on the other side of the gate defines a source;

wherein the access transistors of at least two neighboring magnetic random access memory cells of the array are formed from a common semiconducting nanotube.

2. The memory device of claim 1, wherein the semiconducting nanotubes comprise carbon nanotubes.

3. The memory device of claim 1, wherein the magnetic storage element comprises a Magnetic Tunnel Junction (MTJ).

4. The memory device of claim 1, wherein the word line is a single nanotube.

5. The memory device of claim 1, further comprising a common source line connecting at least some of the sources to ground.

6. The memory device of claim 1, wherein the bit line of each magnetic random access memory cell is a single nanotube.

7. The memory device of claim 1, wherein the word line of each magnetic random access memory cell is a single, multi-walled nanotube.

8. The memory device of claim 1, wherein the bit line of each magnetic random access memory cell is a single, multi-walled nanotube.

9. A memory device, comprising:
a first read/write line;
a second read/write line;
a write line;
a first magnetic storage element disposed between the first read/write line and the write line;
a second magnetic storage element disposed between the second read/write line and the write line; and
an access transistor nanotube forming:
a first access transistor located below the first read/write line and electrically connected to the first read/write line via a first magnetic stack of the first magnetic storage element; and
a second access transistor located below the second read/write line and electrically connected to the second read/write line via a second magnetic stack of the second magnetic storage element.

10. The memory device of claim 9, further comprising a bottom electrode that includes a nanotube that extends from the first magnetic storage element to a via that is electrically coupled to a drain of the first access transistor.

11. The memory device of claim 9, wherein the write line is a single nanotube.

12. The memory device of claim 9, wherein the first read/write line is a single nanotube.

13. The memory device of claim 9, further comprising:
a first nanotube that electrically couples the first magnetic stack to the first read/write line; and
a second nanotube that electrically couples the second magnetic stack to the second read/write line.

14. The memory device of claim 13, wherein the first nanotube is a carbon nanotube.

15. The memory device of claim 13, wherein the first nanotube is a single-walled nanotube.

16. A memory device, comprising:
a plurality of read/write lines;
a write line;
an access transistor nanotube;
a plurality of magnetic random access memory cells, wherein each magnetic random access memory cell includes a magnetic storage element disposed between the write line and an associated read/write line of the plurality of read/write lines; and
an access transistor nanotube that is common to the plurality of magnetic random access memory cells;
wherein the common access transistor nanotube provides a separate access transistor for each magnetic random access memory cell of the plurality of random access memory cells.

17. The memory device of claim 16, wherein each separate access transistor for each magnetic random access memory cell includes a gate oxide and a gate material patterned on the common access transistor nanotube, a drain formed from a portion of the access transistor nanotube on one side of the respective gate, and a source formed from a portion of the access transistor nanotube on the other side of the respective gate.

18. The memory device of claim 16, wherein the write line is a single nanotube.

19. The memory device of claim 16, wherein the magnetic storage element of each magnetic random access memory cell comprises a Magnetic Tunnel Junction (MTJ).

20. The memory device of claim 17, wherein each magnetic random access memory cell further comprises:
a bottom electrode including a nanotube that extends from the respective magnetic storage element to a via that is electrically coupled to the drain of the respective access transistor.

21. The memory device of claim 20, wherein the nanotube of the bottom electrode of each magnetic random access memory cell is a carbon nanotube.

22. The memory device of claim 20, wherein the source of the respective access transistor is connected to ground via a source line.

23. The memory device of claim 1, wherein the read/write line is a single nanotube.

* * * * *